United States Patent [19]

Ohmori et al.

[11] Patent Number: 4,786,816
[45] Date of Patent: Nov. 22, 1988

[54] WAFER DETECTING DEVICE WHEREIN LIGHT RECEIVER HAS AN EFFECTIVE SURFACE LARGER THAN THE DIMENSIONAL RANGE COVERING ALL THE WAFERS BEING DETECTED

[75] Inventors: Taro Ohmori; Hiroaki Kameyama, both of Yokohama, Japan

[73] Assignee: Canon Kabushiki Kaisha, Tokyo, Japan

[21] Appl. No.: 140,864

[22] Filed: Dec. 29, 1987

Related U.S. Application Data

[63] Continuation of Ser. No. 926,470, Nov. 4, 1986.

[30] Foreign Application Priority Data

Jun. 27, 1986 [JP] Japan .................. 61-150981
Nov. 5, 1986 [JP] Japan .................. 60-246253
Nov. 5, 1986 [JP] Japan .................. 60-246254

[51] Int. Cl.$^4$ .................. G01N 21/86; G01V 9/04
[52] U.S. Cl. .................. 250/561
[58] Field of Search .............. 250/561, 222.2, 223 R; 377/52, 53; 414/274, 331

[56] References Cited

U.S. PATENT DOCUMENTS

| | | | |
|---|---|---|---|
| 3,700,121 | 10/1972 | McManus | 414/331 |
| 3,824,020 | 7/1974 | Pease | 250/223 R |
| 3,902,615 | 9/1975 | Levy et al. | 414/331 |
| 4,238,780 | 12/1980 | Doemens | 250/561 |
| 4,259,019 | 3/1981 | Johannsmeier et al. | 250/561 |
| 4,619,573 | 10/1986 | Rathmann et al. | 414/331 |
| 4,625,666 | 12/1986 | Sick | 250/561 |

Primary Examiner—David C. Nelms
Assistant Examiner—William L. Oen
Attorney, Agent, or Firm—Fitzpatrick, Cella, Harper & Scinto

[57] ABSTRACT

A wafer detecting device usable with a carrier has a plurality of wafer carrying portions disposed in stories for carrying wafers thereon. The device comprises a light emitting portion for emitting a light beams so that it passes through the carrier from one side thereof to the other side thereof and in a direction substantially parallel to a plane in which a wafer is carried on a wafer carrying portion of the carrier. A light receiving portion is disposed at the other side of the carrier for detecting presence/absence of the light passed through the carrier. The light emitting portion is arranged to emit the light over a dimensional range covering all the wafer carrying portions with respect to a direction in which the wafer carrying portions are disposed in stories, and the light receiving portion is fixed relative to the carrier and has a light receiving surface having an effective dimensional range greater than the dimensional range covering all the wafer carrying portions with respect to the direction in which the wafer carrying portions are disposed in stories.

20 Claims, 10 Drawing Sheets

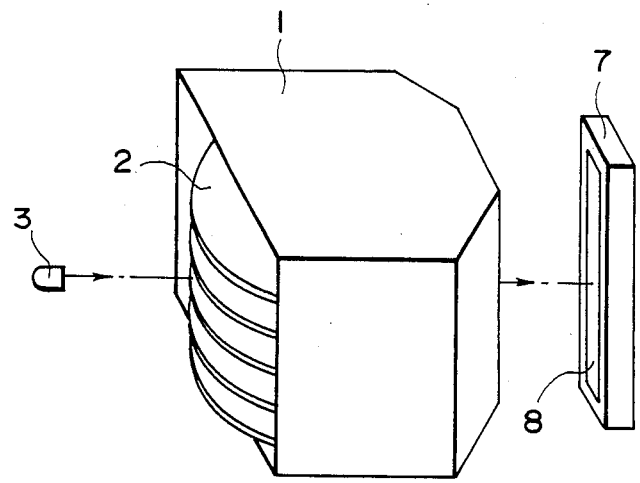
F I G. 1
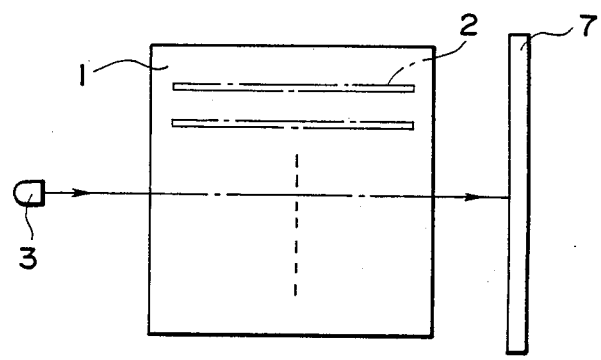
F I G. 2
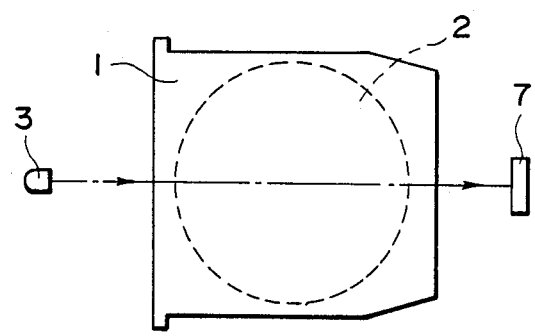
F I G. 3

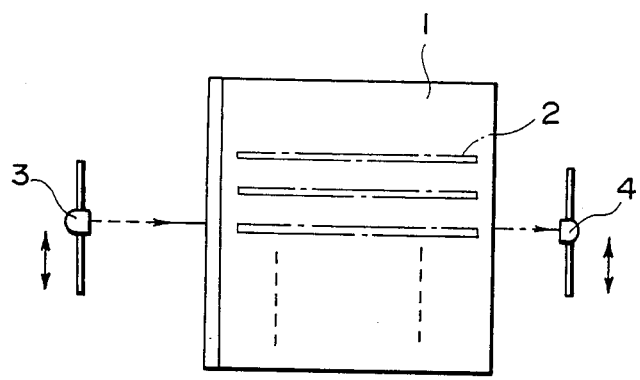
F I G. 6
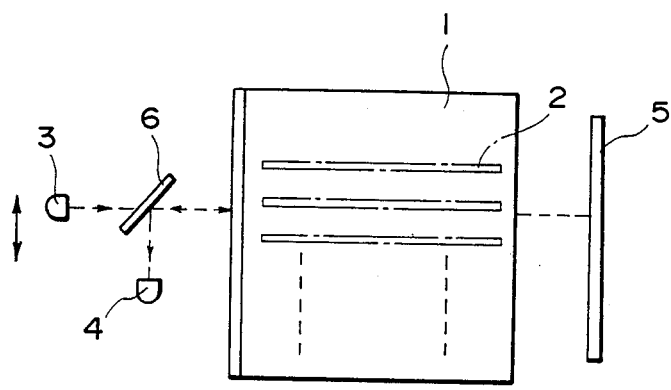
F I G. 7

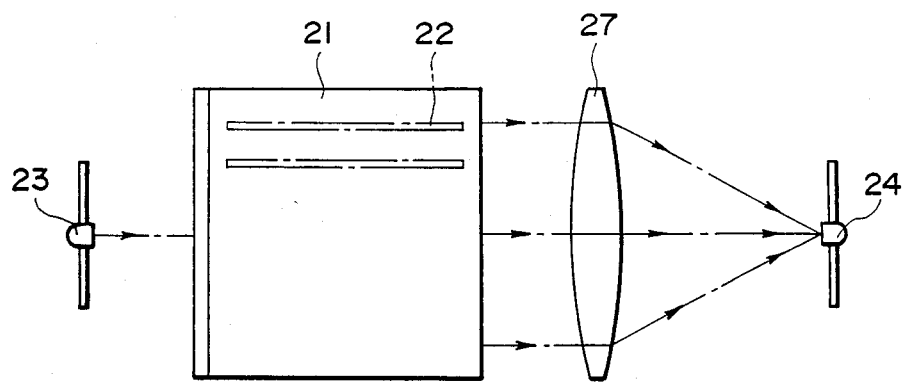
F I G. 8
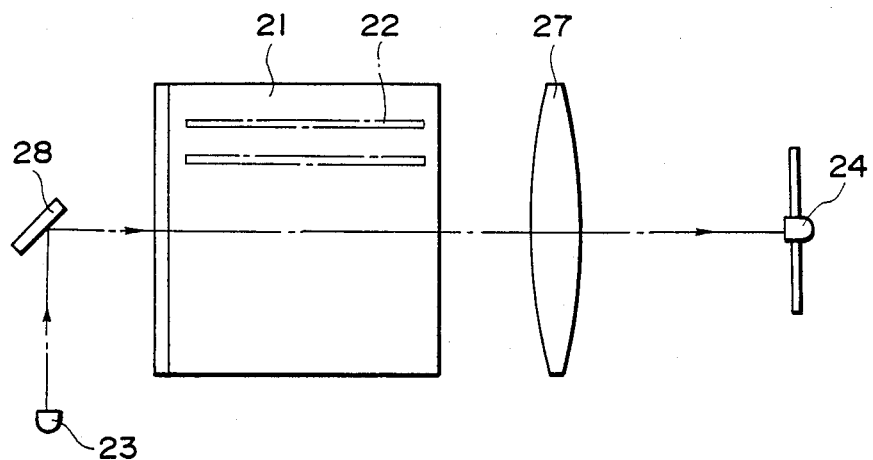
F I G. 9

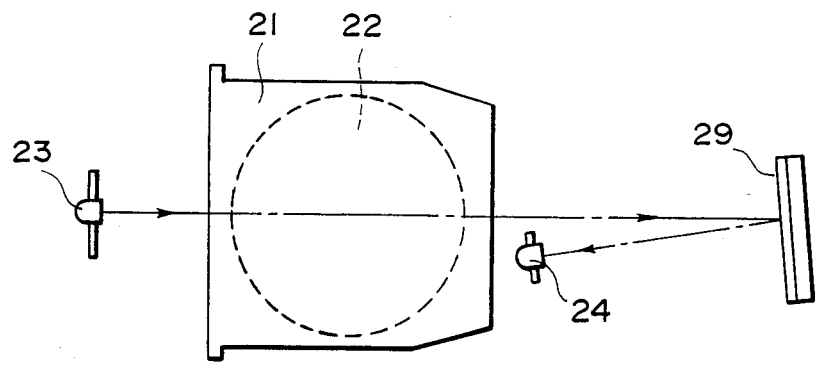
F I G. 10
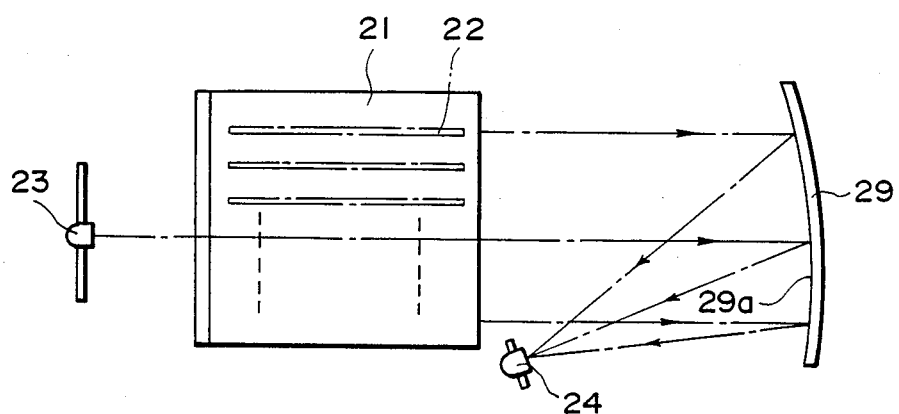
F I G. 11

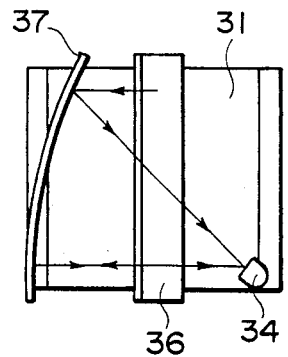
F I G. 17
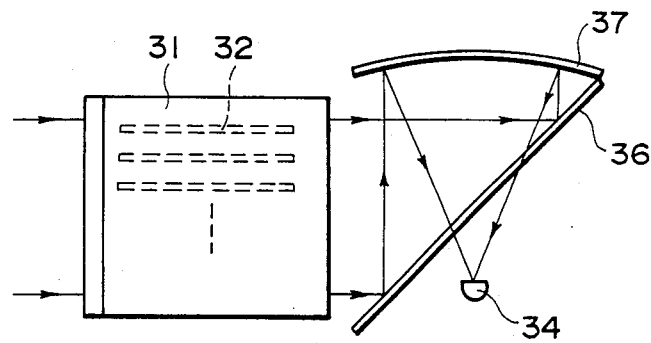
F I G. 18
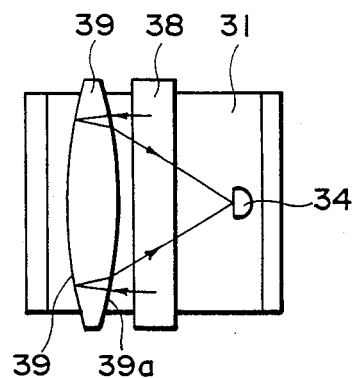
F I G. 19

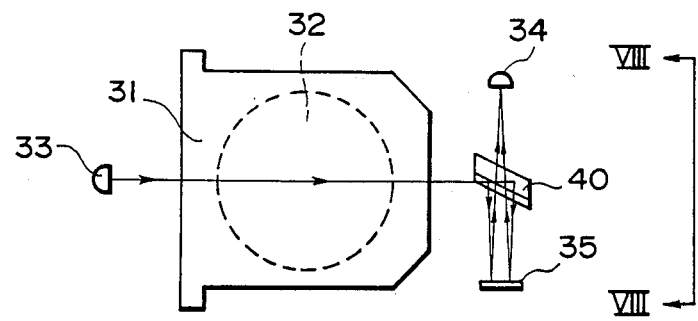
F I G. 20
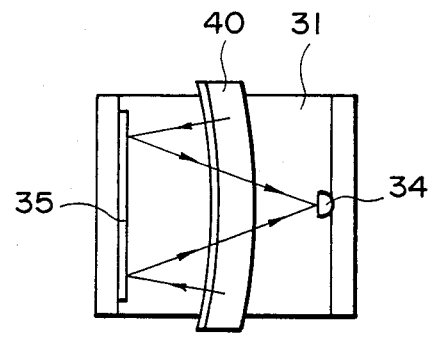
F I G. 21

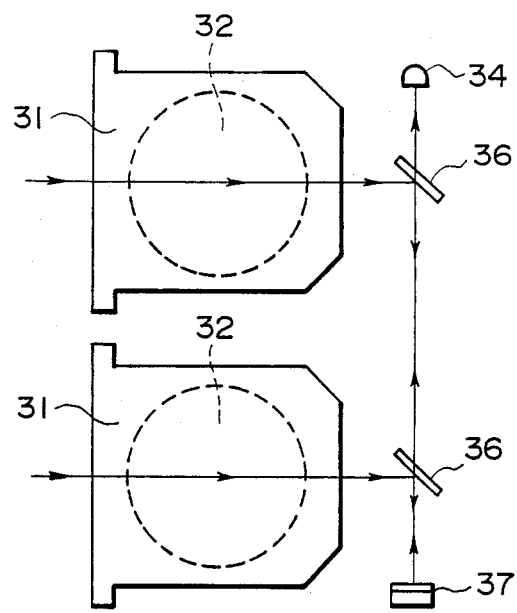
F I G. 22
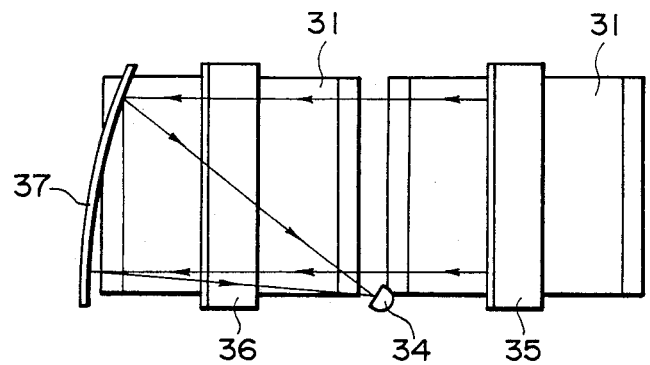
F I G. 23

WAFER DETECTING DEVICE WHEREIN LIGHT RECEIVER HAS AN EFFECTIVE SURFACE LARGER THAN THE DIMENSIONAL RANGE COVERING ALL THE WAFERS BEING DETECTED

This application is a continuation, of application Ser. No. 926,470 filed Nov. 4, 1986.

FIELD OF THE INVENTION AND RELATED ART

This invention relates to a wafer detecting device and, more particularly, to a wafer detecting device usable, e.g., with a semiconductor device manufacturing apparatus, for optically detecting the presence/absence of a wafer in a wafer carrier and the position of the wafer in the wafer carrier, when the wafer is to be extracted automatically from the wafer carrier.

In the field of manufacture of semiconductor devices such as integrated circuits, wafers to be processed by a semiconductor device manufacturing apparatus are kept in a wafer carrier having a plurality of wafer supporting shelves. In order that the wafers are automatically inserted into or extracted from the wafer carrier, it is necessary to pre-detect the presence/absence of wafers in the carrier and the positions of the wafers in the carrier. That is, one wafer carrier is not always filled with wafers of a predetermined number. If, therefore, the automatic wafer extracting operation is tried for such wafer supporting shelf that supports no wafer, is merely leads to loss of time. Moreover, in some cases, the mechanism will be stopped.

Known type wafer detecting systems for detecting presence/absence of wafers and their positions, are generally classified into two types, a contact type and a non-contact type. The contact type wafer detecting systems use a small engaging element, and the presence/absence of any wafer in the wafer carrier is discriminated depending on whether or not the engaging element engages with an edge of the wafer. The non-contact type wafer detecting systems use an electrostatic sensor, a photoelectric sensor, etc., for detecting the presence/absence of the wafer without contact thereto. Usually, the non-contact type is preferred. Generally, however, the wafers when they are in the wafer carrier are at various positions with respect to the horizontal direction, i.e. the wafer inserting/extracting detection. Where the electrostatic sensor is used, such varying positions of the wafers result in variation in the interval between the electrostatic sensor and each of the edges of the wafers contained in the carrier. Such varying interval disadvantageously makes the detection unstable. As compared therewith, the non-contact type system using the photoelectric sensor is not easily effected by the size of the carrier, the positions of the wafers contained in the carrier, and so on. Therefore, stable detection is attainable. Basically, the detecting system of this type includes a light emitting portion and a light receiving portion, and the presence/absence of a wafer is detected depending on whether or not a light from the light emitting portion to the light receiving portion is intercepted by the wafer. Examples of such photoelectric type wafer detecting devices are disclosed in U.S. patent application Ser. Nos. 763,213 filed Aug. 7, 1985 and 776,887 filed Sept. 17, 1986, both of which are assigned to the assignee of the subject application.

SUMMARY OF THE INVENTION

As the background for understanding the present invention, reference will now be made to FIGS. 6 and 7 of the drawings. Of these figures, FIG. 6 shows an example of a photoelectric type wafer detecting device which includes a light emitting portion 3 movably disposed at a side of a carrier 1, containing wafers 2, and a light receiving portion 4 movably disposed at the other side of the carrier 1. The light receiving portion 4 is aligned with the light emitting portion 3 so that it receives light emitted from the light emitting portion 3. The light emitting portion 3 and the light receiving portion 4 are movable upwardly and downwardly, i.e. in the direction of stack of wafer supporting shelves of the carrier 1, with their aligned relation being maintained. By this movement, the presence/absence and the position of each of the wafers in the carrier 1 is detected.

FIG. 7 shows another example of wafer detecting device. In this example, a light emitting portion 3 and a light receiving portion 4 are combined at a side of a carrier 1 by use of a half mirror 6. Disposed at the other side of the carrier 1 is a mirror 5 for reflecting the light emitted from the light emirting portion 3 so that it goes back along its oncoming path. The light from the mirror 5 is reflected by the half mirror 6 toward the light receiving portion 4. The light emitting portion 3, the light receiving portion 4 and the half mirror 6 are moved as a unit upwardly and downwardly, thereby to detect the presence/absence of each of wafers 2 in the carrier 1.

In the case of FIG. 6, the light emitting portion 3 and the light receiving portion 4 which are spaced away from each other with the carrier 1 being interposed therebetween, have to be translated while maintaining their aligned relation. Accordingly, the mechanism for driving them should have very high accuracy. Also, its structure is complicated and occupies a large space.

In the case of FIG. 7, the light emitting portion, the light receiving portion 4 and the half mirror 6 which are the movable components are juxtaposed to one another. Therefore, the mechanism for driving them can be of simple structure. However, a long light path is necessary from the light emitting portion 3 to the light receiving portion 4. As a result, it is not easy to align the light emitting portion 3 with the light receiving portion 4. Also, the reflecting surface of the mirror 5 must be disposed exactly in parallel to the moving direction of the movable components.

It is accordingly a primary object of the present invention to provide a wafer detecting device which is free from the inconveniences described above.

It is another object of the present invention to provide a wafer detecting device which avoids the necessity of moving a light emitting portion and a light receiving portion as a unit, thus allowing use of a driving mechanism of very simple structure.

It is a further object of the present invention to provide a wafer detecting device for optically detecting the presence/absence and the position of a wafer in a wafer carrier, very stably and without the necessity of a long span between a light emitting portion and a light receiving portion.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a perspective view schematically showing a wafer detecting device according to a first embodiment of the present invention.

FIG. 2 is a schematic side view of the device shown in FIG. 1.

FIG. 3 is a schematic plan view of the device shown in FIG. 1.

FIG. 6 is a schematic side view of a wafer detecting device which has been described for the sake of understanding the present invention.

FIG. 7 is a schematic side view of another example of wafer detecting device which has also been described for the sake of understanding the present invention.

FIG. 8 is a schematic side view of a wafer detecting device according to a second embodiment of the present invention.

FIG. 9 is a schematic side view of a wafer detecting device which is a modified form of the second embodiment shown in FIG. 8.

FIG. 10 is a schematic plan view of a wafer detecting device which is another modified form of the second embodiment shown in FIG. 8.

FIG. 11 is a schematic side view of the device shown in FIG. 10.

FIG. 17 is a view similar to FIG. 15 but showing another modified form of the third embodiment.

FIG. 18 is a schematic side view of a wafer detecting device which is a further modified form of the third embodiment shown in FIG. 14.

FIG. 19 is a rear view of a wafer detecting device which is similar to the FIG. 16 example.

FIG. 20 is a schematic view of a wafer detecting device which is a further modified form of the third embodiment shown in FIG. 14.

FIG. 21 shows the device of FIG. 20 as viewed in the direction of an arrow VIII—VIII in FIG. 20.

FIG. 22 is a schematic plan view of a wafer detecting device which is a still further modified form of the third embodiment shown in FIG. 14.

FIG. 23 is a rear view of a wafer detecting device which is similar to the FIG. 22 example.

DESCRIPTION OF THE PREFERRED EMBODIMENTS

Figure 4:
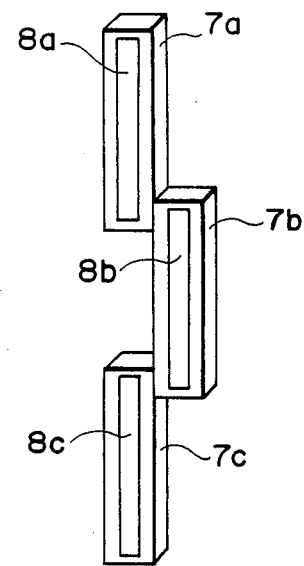
FIG. 4 is a perspective view schematically showing another example of a light receiving portion included in the device of FIG. 1.

Referring now to FIGS. 1–3, there is shown a wafer detecting device according to a first embodiment of the present invention. Denoted in these Figures by numeral 1 is a carrier; by 2, semiconductor wafers which are kept in the carrier 1; by 3, a light emitting portion for emitting light; by 7, a light receiving portion for receiving the light from the light emitting portion 3; and by 8, a light receiving surface of the portion 7. The carrier 1 includes a plurality of wafer supporting shelves, not shown, which are stacked or disposed in stories in the vertical direction with a predetermined interval maintained between adjacent shelves. Thus, plural wafer accommodating portions disposed in stories are defined in the carrier 1. Each of the wafers 2 is placed on corresponding one of the wafer supporting shelves. The light emitting portion 3 is arranged to emit a light beam toward the carrier 1 so that it advances substantially in parallel to the wafer supporting planes in the carrier and passes through the carrier 1 from one side thereof to the other side thereof and finally is incident on the light receiving surface of the light receiving portion 7. Also, the light emitting portion 3 is arranged such that the light beam emitted therefrom has a sectional shape of a size, with respect to the direction of thickness of the wafer in the carrier 1, which is sufficiently smaller than the thickness of the wafer. The axis of the light beam from the light emitting portion 3 is thus parallel to the planes in which the wafers 2 are held by the wafer supporting shelves of the carrier 1. The light emitting portion 3 is moved upwardly/downwardly so that the axis of the light beam is translated in the direction of stories of the wafer supporting shelves while being maintained in parallel to the wafer supporting planes. By this movement, the edges of the wafers 2 contained in the carrier 1 are scanned with the light beam from the light emitting portion 3. When the light emitting portion 3 reaches a position at which the axis of the light beam therefrom coincides with a particular wafer 2, the reception of light at the light receiving portion 7 is interrupted. Thus, on the basis of the scanning position of the light emitting portion 3 and in accordance with the output of the light receiving portion 7, the presence/absence of any wafer on each of the wafer supporting shelves in the carrier 1 as well as the position of each of the wafers contained in the carrier 1 can be detected.

In this embodiment, a single photoreceptor is used so as to cover the wafer detection with reference to all the wafer carrying shelves of the carrier 1. However, plural photoreceptors such as at 7a–7c in FIG. 4 may be disposed in a manner that assures continuity, of their light receiving surfaces 8a–8c, with respect to the direction of stories of the wafer supporting shelves. In such case, the light emitting portion is arranged to produce a light beam of sheet-like shape in section having a width sufficient for compensating for positional deviation between the photoreceptors with respect to their widthwise direction.

In this embodiment, the scanning position of the light beam is utilized for the sake of detection of the wafer position. However, the invention is not limited thereto. For example, the light receiving portion 7 may comprise an array of plural minute photoreceptors of a number sufficient for attaining desired detection accuracy. The array of the photoreceptors extends in the direction of the stories described above. And, by self-scanning of the photoreceptors during reception of light, positional information can be included in the outputs of the photoreceptors. By doing so, the presence/absence of wafers and the positions thereof can be detected only on the basis of the outputs of the light receiving portion 7.

Figure 5:
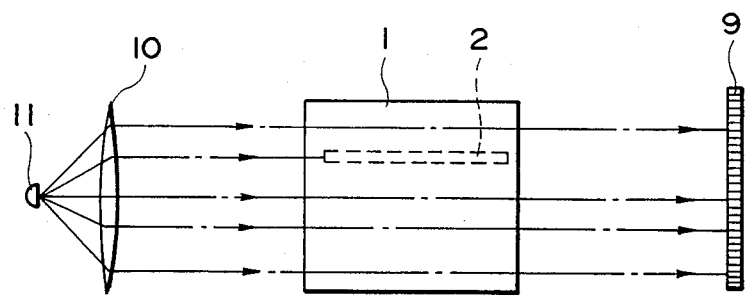
FIG. 5 is a schematic side view of a wafer detecting device which is a modified form of the first embodiment shown in FIG. 1.

FIG. 5 shows a modified form of the first embodiment. In the FIG. 5 example, the light receiving portion comprises a photoreceptor array 9. On the other hand, the light emitting portion comprises a lens 10 and a point light source 11 disposed at a focal point of the lens 10. Thus, the light source 11 and the lens 10 cooperate with each other to provide source means for producing parallel light beams. In this arrangement, the source means emits, at a time, parallel rays toward an area which is wider than the range of stories of all the wafer accommodating portions of the carrier 1. Thus, on the surface of the photoreceptor array 9, a pattern comprising dark portions and bright portions corresponding to the presence/absence of the wafers, is formed. By analizing, within the photoreceptor array 9, the position of each of the photoreceptors in the array and the presence/absence of the output of each photoreceptor, the presence/absence of wafers 2 in the carrier 1 and the position of each of the wafers can be detected. And, this is attainable within a completely static system. As for the lens 10 in this example, it is only necessary that the range of parallel-beam irradiation covers the range of stories of the wafer accommodating portions. Accordingly, a cylindrical lens system may be used as the lens 10 so as to reduce the size. Also, the lens 10 may be replaced by a paribolic concave mirror of cylindrical shape.

In accordance with the first embodiment of the present invention, as described in the foregoing, the wafers within the carrier can be detected without moving the light receiving portion and by use of a substantially single or integral light receiving portion. Since there is no necessity of moving the light emitting portion and the light receiving portion as a unit, the mechanical structure can be made simple. Also, it is not necessary to align the light emitting portion and the light receiving portion very accurately. Therefore, high accuracy is not required for the movable elements such as the scanning components. Moreover, in accordance with one aspect of the present embodiment, the detecting device can be provided only by a static system in which no mechanically movable element is necessary. Thus, a wafer detecting device which ensures stable detection of wafers, with a simple structure and with a smaller space being occupied, is obtainable.

Referring now to FIG. 8, there is shown a wafer detecting device according to a second embodiment of the present invention. Denoted in this figure by numeral 21 is a carrier; by 22, wafers which are held in the carrier 21; by 23, a light emitting portion for emitting light; by 24, a light receiving portion for receiving the light from the light emitting portion 23; and by 27, a condensing lens. The carrier 21 includes a plurality of wafer supporting shelves, not shown, for carrying thereon wafers 22, respectively. The light emitting portion 23 is arranged to emit a light beam toward the carrier 21 so that it advances substantially in parallel to the wafer supporting planes in the carrier and passes through the carrier 21 from one side thereof to the other side thereof and finally is incident on the light receiving portion 24 by way of the condensing lens 27. Also, the light emitting portion 23 is arranged such that the light beam emitted therefrom has a sectional shape of a size, with respect to the direction of thickness of the wafer in the carrier, which is sufficiently smaller than the thickness of the wafer. The light receiving portion 24 has a light receiving surface which is disposed at a focal point of the condensing lens 27. Thus, when parallel light beams are incident on the lens 27, they converge upon the light receiving surface of the light receiving portion 24. The axis of the light beam from the light emitting portion 27 is parallel to the planes in which the wafers 22 are held by the wafer carrying shelves of the carrier 21. The light emitting portion 23 is moved so as to translate the axis of the light beam in the direction of stories of the wafer carrying shelves. Thus, by the movement of the light emitting portion 23, the edges of the wafers 22 contained in the carrier 21 are scanned with the light beam from the portion 23. Such optical scanning is effected over all the wafer accommodating portions in the carrier 21. When, during such optical scanning, the light emitting portion 23 reaches a position at which the axis of the light beam therefrom coincides with one of the wafers 22, the reception of light at the light receiving portion 24 is interrupted. In this manner, the presence/absence of any wafer on each of the wafer carrying shelves within the carrier 21 as well as the position of each of wafers contained in the carrier 21, can be detected on the basis of the scanning position and the output from the light receiving portion 24.

FIG. 9 shows a modified form of the second embodiment. In the FIG. 9 example, the light emitting portion 23 is fixedly disposed in an orientation parallel to the direction of stories of the wafer carrying shelves. On the other hand, the device employs a mirror 28 for deflecting, at a right angle, the light beam from the portion 23 toward the light receiving portion 24. The mirror 28 is moved in the direction of the stories so as to scan the wafers 22. The remaining portion of the structure and the operation of the FIG. 9 example is the same as the corresponding portion of the FIG. 8 embodiment.

FIGS. 10 and 11 show a wafer detecting device which is a modification of the FIG. 8 embodiment. In the example of FIGS. 10 and 11, a concave mirror 29 is used in place of the condenser lens. As a matter of course, the light receiving portion 4 is disposed at a focal point position of the concave mirror 29. For every scanning position of the light emitting portion 23, the light beam from the portion 23 is reflected by a mirror surface 29a of the concave mirror 29, and the reflected light is convergently incident on a light receiving portion 24 which is at a fixed position.

Figure 12:
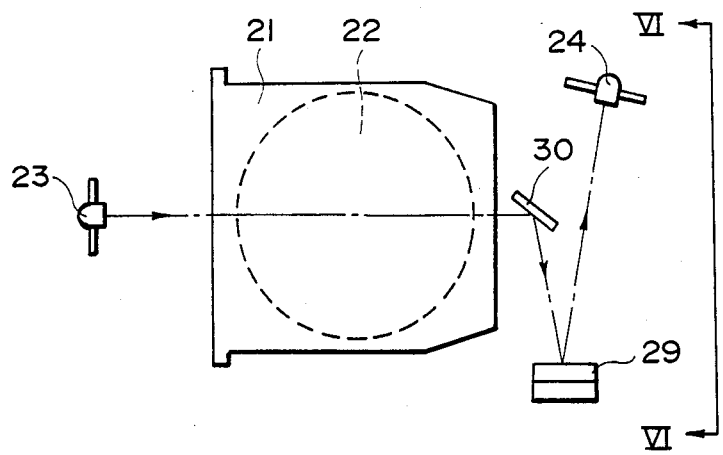
FIG. 12 is a schematic plan view of a wafer detecting device which is a further modified form of the second embodiment shown in FIG. 8.
Figure 13:
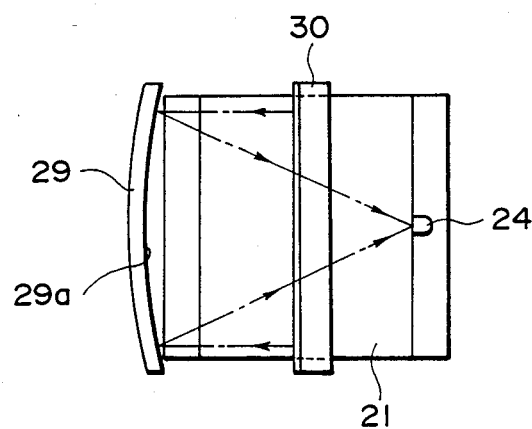
FIG. 13 shows the device of FIG. 12 as viewed in the direction of an arrow VI—VI in FIG. 12.

FIGS. 12 and 13 show another example using a concave mirror 29. In this example, a flat mirror 30 is provided at a position upstream of the concave mirror 29 with respect to the direction of advancement of the light from the light emitting portion 23. The mirror 30 deflects the path of the light, thereby to reduce the size of the device on the right-hand side of the carrier 21.

It will be readily understood that, in the second embodiment and its modifications, each of the lens 27, the concave mirror 29 and the flat mirror 30 may be replaced by a cylindrical lens system, a cylindrical concave mirror or an elongated flat mirror having a width approximately equal to the diameter of the light reeiving surface of the light receiving element 24.

In accordance with the concept of the second embodiment, as has been described in the foregoing, the wafers in the carrier can be detected without the necessity of moving the light receiving portion and, nevertheless, by use of a single and small-size light receiving element. Since there is no necessity of moving the light emitting portion and the light receiving portion as a unit, the mechanical structure can be made simple. Also, it is not necessary to align the light emitting portion and the light receiving portion very accurately.

Therefore, high accuracy is not required for the movable components used in the scanning mechanism. Furthermore, the structure can be made very simple and compact.

Figure 14:
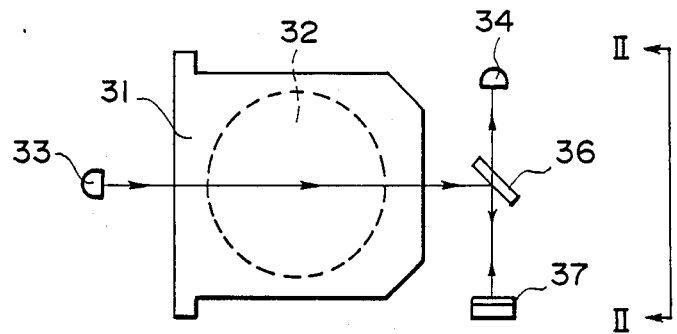
FIG. 14 is a schematic plan view of a wafer detecting device according to a third embodiment of the present invention.
Figure 15:
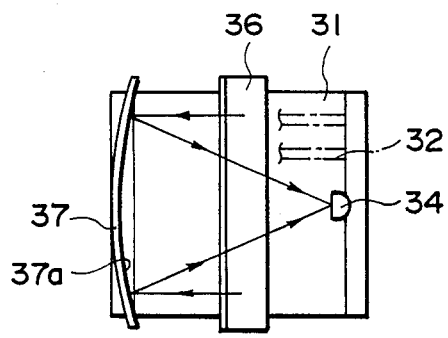
FIG. 15 shows the device of FIG. 14 as viewed in the direction of an arrow II—II in FIG. 14.

Referring now to FIGS. 14 and 15, there is shown a wafer detecting device according to a third embodiment of the present invention. Denoted in these Figures by numeral 31 is a carrier; by 32, wafers which are kept in the carrier 31; by 33, a light emitting portion for emitting light; by 34, a light receiving portion for receiving the light from the light emitting portion 33; by 36, a half mirror; and by 37, a concave mirror. The carrier 31 includes a plurality of wafer carrying shelves, not shown, for carrying thereon wafers 32, respectively. The light emitting portion 33 is arranged to emit a light beam toward the carrier 31 so that it advances substantially in parallel to the wafer supporting planes in the carrier and passes through the carrier 1 from one side thereof to the other side thereof. The light beam passed through the carrier 31 is reflected by the half mirror 36 toward the concave mirror 37, and it is reflected by a mirror surface 37a of the concave mirror 37 back to the half mirror 36. The light beam from the concave mirror 37 passes through the half mirror 36 and is incident on the light receiving portion 34. The light receiving portion 34 has a light receiving surface which is positioned at a focal point of the concave mirror 37. Thus, when parallel light beams are incident on the half mirror 36, finally they are convergently incident upon the light receiving surface of the light receiving portion 34.

The light emitting portion 33 is arranged such that the light beam emitted therefrom has a sectional shape of a size, with respect to the direction of thickness of the wafer in the carrier, which is sufficiently smaller than the thickness of the wafer. Also, the light emitting portion 33 is made movable so as to translate the axis of the light beam emitted therefrom in the direction parallel to the direction of stories of the wafer carrying shelves. By this movement, the edges of the wafers 32 contained in the carrier 31 are scanned with the light beam from the portion 33. Such optical scanning is effected over all the wafer accommodating portions within the carrier 31. When, during the optical scanning, the light emitting portion 33 reaches a position at which the axis of the light beam therefrom coincides with one of the wafers, the reception of light at the light receiving portion 34 is interrupted. In this manner, the presence/absence of any wafer on each of the wafer carrying shelves within the carrier 31 as well as the position of each of the wafers contained in the carrier 31, can be detected on the basis of the scanning position and the output from the light receiving portion 34. If the axis of the light beam from the portion 33 is not coincident with any wafer, the light beam is directed to the light receiving portion 34 by way of the half mirror 36 and the concave mirror 37. In such case, the light beam from the portion 33 is acted on, twice, by the half mirror 36. Accordingly, where the half mirror 36 has a transmission factor of an order of approx. 50% and a reflection factor of an order of approx. 50%, the amount of light incident on the light receiving portion 34 will be approximately equal to a quarter of the quantity of light emitted from the light emitting portion 33.

Figure 16:
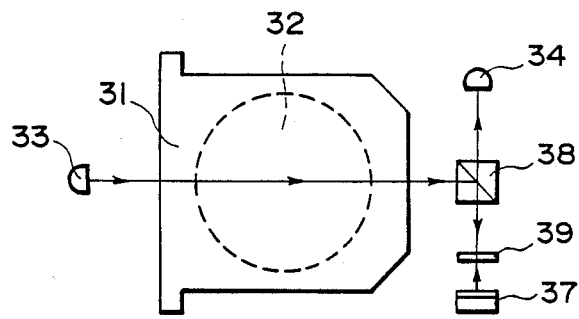
FIG. 16 is a schematic plan view of a wafer detecting device which is a modified form of the third embodiment shown in FIG. 14.

FIG. 16 shows a modified form of the FIG. 14 embodiment. In this modification, a polarization beam splitter 38 is used in place of the half mirror 36 of the FIG. 14 embodiment. In the example of FIG. 16, the light beam emitted from the light emitting portion 33 is incident on the polarization beam splitter 38, unless it is blocked by any wafer. The light incident on the polarization beam splitter 38 is reflected thereby toward the concave mirror 37. A quarter waveplate 39 is disposed between the polarization beam splitter 38 and the concave mirror 37. When the light beam from the beam splitter 38 passes through the quarter waveplate 39, its phase is rotated by $\lambda/4$. The light, after being reflected by a mirror surface 37a of the concave mirror 37, passes again the quarter waveplate 39. By this, its phase is further rotated by $\lambda/4$. Therefore, the light emerging from the quarter waveplate 39 toward the beam splitter 38 has a direction of polarization which is rotated by $\lambda/2$ as compared with the light reflected from the beam splitter 38 to the quarter waveplate 39. Thus, substantially all of the light beam incident again on the polarization beam splitter 38 is transmitted to the light receiving portion 34. This results in that a larger amount of light is detectable at the light receiving portion 34, as compared with the embodiment of FIG. 14. This is preferable.

FIGS. 17 and 18 show modified forms of the embodiment described with reference to FIGS. 14 and 15. As will be seen from FIGS. 17 and 18, the wafer detecting device of the type of the FIG. 14 embodiment can be designed in various ways, depending on the space prepared for the device, although a half mirror 36 of larger size is necessary in the case of FIG. 18.

FIG. 19 shows an arrangement which is similar to that of the FIG. 16 example. In the example of FIG. 19, a convex mirror 39 is used in place of the concave mirror 37 and the quarter waveplate 39 of the FIG. 16 example. The convex lens 39 has a surface 39a which is coated with a suitable material so as to provide a function equivalent to that of the quarter waveplate. Also, the lens 39 has another surface 39b which is coated with a suitable material so as to provide a mirror surface. Use of such convex lens leads to further reduction in size of the space to be occupied by the wafer detecting device.

FIGS. 20 and 21 show a wafer detecting device which is a further modification of the embodiment described with reference to FIGS. 14 and 15. In the example shown in FIGS. 20 and 21, the half mirror 36 of the FIG. 14 embodiment is replaced by an arcuate spherical mirror 40 having a surface coated with a suitable material to provide a half-mirror surface. Also, the concave mirror 37 of the FIG. 14 embodiment is replaced by a flat mirror 35. With this arrangement, the axis of light reflected by the mirror 35 and then reflected again by the arcuate spherical mirror 40 toward the emitting portion side has an angle relative to the axis of the light emitted from the light emitting portion 33. Therefore, the reflected light does not go back to the light emitting portion 33.

FIG. 22 shows a wafer detecting device, utilizing the concept of the FIG. 14 embodiment. In the example of FIG. 22, as shown, two carriers 31 are juxtaposed to each other. As will be seen from FIG. 22, by enlarging the focal distance of the concave mirror 37, all the wafers in the two carriers can be detected only with the addition of one half mirror 36.

FIG. 23 shows an example of a modified form of the FIG. 22 arrangement. In the example of FIG. 23, a mirror 35 is used in combination with a half mirror 36. By doing so, the loss of light quantity at the half mirror is reduced.

In the third embodiment and its modifications described above, it is sufficient for each of the mirror 35, the half mirror 36, the polarization beam splitter 38 and the quarter waveplate 39 to have a width approximately equal to the diameter of the light receiving surface of the light receiving element 34. Also, each of the concave mirror 37 and the convex lens 39 may be replaced by a cylindrical concave mirror or a cylindrical lens system having a similar width.

In accordance with the concept of the third embodiment of the present invention, as has hitherto been described, the wafers in the carrier can be detected without the necessity of moving the light receiving portion and, nevertheless, by use of a single and small-size light receiving element. Since there is no necessity of moving the light emitting portion and the light receiving portion as a unit, the mechanical structure can be made simple. Also, it is not necessary to align the light emitting portion with the light receiving portion very accurately. Therefore, high accuracy is not required for the movable components of the scanning mechanism. Moreover, use of optical-path turning means such as one or more half mirrors or a polarization beam splitter, within the light collecting or concentrating means at the light-receiving portion side, allows freedom of geometrical design of the apparatus. Also, the adjustment of the axis is easy. Further, the space to be occupied by the detecting device is reduced significantly.

While the invention has been described with reference to the structures disclosed herein, it is not confined to the details set forth and this application is intended to cover such modifications or changes as many come within the purposes of the improvements or the scope of the following claims.

What is claimed is:

1. A wafer detecting device usable with a carrier having a plurality of wafer carrying portions disposed in stories, in the direction of an axis, for carrying wafers therein, said device comprising:
   light emitting means for emitting light so that it passes through the carrier from a first side thereof to a second side thereof and in a direction substantially parallel to a plane in which a wafer is carried on a wafer carrying portion of the carrier; and
   light receiving means disposed at said second side of the carrier, for detecting the presence or absence of the light passed through the carrier,
   wherein said light emitting means is arranged to irradiate with light having a dimensional range covering all the wafer carrying portions disposed along said axis, and wherein said light receiving means is fixed relative to the carrier and has a light receiving surface having an effective dimensional range which is greater than the dimensional range covering all the wafer carrying portions disposed along said axis.

2. A device according to claim 1, wherein said light emitting means includes scanning means for producing a light beam having a cross-section smaller than a thickness of the wafer, and for scanningly translating the light beam in a direction substantially parallel to said axis.

3. A device according to claim 2, wherein said scanning means includes a point light source which is displaceable.

4. A device according to claim 2, wherein said scanning means includes a point light source for producing the light beam and an optical member for deflecting the light beam from said point light source, and wherein said optical member is displaceable.

5. A device according to claim 2, wherein presence/absence of a wafer in the carrier and the position of the wafer in the carrier is detected on the basis of the position of scan by said scanning means and the detection by said light receiving means of the presence/absence of the light.

6. A device according to claim 1, wherein said light receiving receiving means includes an array of photoelectric elements for detecting a position of light reception in the direction parallel to said wafer axis.

7. A device according to claim 6, wherein said light emitting means is arranged to emit, at one time, parallel light rays to the dimensional range covering all the wafer carrying portions disposed along said axis.

8. A wafer detecting device usable with a carrier having a plurality of wafer carrying portions disposed, along an axis, in stories for carrying wafers thereon, said device comprising:
   light emitting means for emitting light so that it passes through the carrier from a first side thereof to a second side thereof and in a direction substantially parallel to a plane in which a wafer is carried on a wafer carrying portion of the carrier; and
   light receiving means disposed at said second side of the carrier, for detecting the presence or absence of the light passed through the carrier;
   wherein said light emitting means includes scanning means for translating the light in a direction substantially parallel to said axis and over a dimensional range covering all the wafer carrying portions disposed along said axis, and wherein said light receiving means is fixed relative to the carrier and include optical means disposed at said second side of the carrier for directing to a light receiving surface of said light receiving means the light emerging from the carrier in the dimensional range covering all the wafer carrying portions.

9. A device according to claim 8, wherein said light emitting means includes means for producing a light beam having a cross-section smaller than a thickness of the wafer.

10. A device according to claim 8, wherein said scanning means includes a point light source which is displaceable.

11. A device according to claim 8, wherein said scanning means includes a point light source for producing the light beam and an optical member for deflecting the light beam from said point light source, and wherein said optical member is displaceable.

12. A device according to claim 8, wherein the presence or absence of a wafer in the carrier and the position of the wafer in the carrier is detected on the basis of the position of scan by said scanning means and the detection by said light receiving means of the presence or absence of the light.

13. A device according to claim 8, wherein said optical means comprises a condensing lens.

14. A device according to claim 8, wherein said optical means comprises a concave mirror.

15. A wafer detecting device usable with a carrier having a plurality of wafer carrying portions disposed in stores along a wafer axis for carrying wafers thereon, said device comprising:
   light emitting means for emitting light so that it passes through the carrier from a first side thereof to a second side thereof and in a direction substantially parallel to a plane in which a wafer is carried on a wafer carrying portion of the carrier; and light receiving means disposed at said second side of the carrier, for detecting the presence or absence of the light passed through the carrier;

wherein said light emitting means includes scanning means for translating the light in a direction substantially parallel to the axis and over a dimensional range covering all the wafer carrying portions disposed along said axis, and wherein said light receiving means is fixed relative to the carrier and includes optical means for directing, to a light receiving surface of said light receiving means, the light emerging from the carrier in the dimensional range covering all the wafer carrying portions disposed along said axis and wherein said optical means is disposed at said second side of the carrier and includes optical path changing means.

16. A device according to claim 15, wherein said light emitting means includes means for producing a light beam having a cross-section smaller than a thickness of the wafer.

17. A device according to claim 15, wherein said scanning means includes a point light source which is displaceable.

18. A device according to claim 15, wherein said scanning means includes a point light source for producing the light beam and an optical member for deflecting the light beam from said point light source, and wherein said optical member is displaceable.

19. A device according to claim 15, wherein the presence or absence of a wafer in the carrier and the position of the wafer in the carrier is detected on the basis of the position of scan by said scanning means and the detection by said light receiving means of the presence/absence of the light.

20. A device according to claim 15, wherein said optical means includes one of a concave mirror, an arcuate spherical mirror, a condensing lens, or a combination of said concave mirror, arcuate spherical mirror and concave mirror.

* * * * *

UNITED STATES PATENT AND TRADEMARK OFFICE
CERTIFICATE OF CORRECTION

PATENT NO. : 4,786,816

DATED : November 22, 1988

INVENTOR(S) : TARO OHMORI, ET AL.

Page 1 of 2

It is certified that error appears in the above-identified patent and that said Letters Patent is hereby corrected as shown below:

IN [57] ABSTRACT

Line 4, "beams" should read --beam--.

COLUMN 1

Line 31, "is" should read --it--.
    Line 56, "effected" should read --affected--.

COLUMN 2

Line 39, "light emitting portion," should read --light emitting portion 3,--.

COLUMN 5

Line 15, "izing," should read --yzing,--.
    Line 26, "paribolic" should read --parabolic--.

COLUMN 6

Line 57, "reeiv-" should read --receiv- --.

COLUMN 9

Line 30, "many" should read --may--.

UNITED STATES PATENT AND TRADEMARK OFFICE
CERTIFICATE OF CORRECTION

PATENT NO. : 4,786,816
DATED : November 22, 1988
INVENTOR(S) : TARO OHMORI, ET AL.   Page 2 of 2

It is certified that error appears in the above-identified patent and that said Letters Patent is hereby corrected as shown below:

COLUMN 10

Line 8, "receiving receiving" should read --receiving--.
    Line 33, "include" should read --includes--.
    Line 62, "stores" should read --stories--.

Signed and Sealed this

Sixteenth Day of January, 1990

Attest:

JEFFREY M. SAMUELS

Attesting Officer    Acting Commissioner of Patents and Trademarks